US006998059B2

United States Patent
Kuisma et al.

(10) Patent No.: US 6,998,059 B2
(45) Date of Patent: Feb. 14, 2006

(54) METHOD FOR MANUFACTURING A SILICON SENSOR AND A SILICON SENSOR

(75) Inventors: Heikki Kuisma, Helsinki (FI); Juha Lahdenperä, Espoo (FI); Risto Mutikainen, Espoo (FI)

(73) Assignee: VTI Technologies Oy, Vantaa (FI)

( * ) Notice: Subject to any disclaimer, the term of this patent is extended or adjusted under 35 U.S.C. 154(b) by 0 days.

(21) Appl. No.: 10/472,465

(22) PCT Filed: Mar. 21, 2002

(86) PCT No.: PCT/FI02/00241

§ 371 (c)(1),
(2), (4) Date: Nov. 24, 2003

(87) PCT Pub. No.: WO02/082100

PCT Pub. Date: Oct. 17, 2002

(65) Prior Publication Data

US 2004/0074301 A1    Apr. 22, 2004

(30) Foreign Application Priority Data

Mar. 21, 2001    (FI)    ................................. 20010582

(51) Int. Cl.
*C23F 1/00*    (2006.01)
(52) U.S. Cl. ........................................... 216/2; 438/53

(58) Field of Classification Search ............ 438/52–53, 438/702, 738, 748; 216/2, 11, 48, 83, 96
See application file for complete search history.

(56) References Cited

U.S. PATENT DOCUMENTS

| 4,922,756 A | * | 5/1990 | Henrion ................... 73/514.18 |
| 5,484,073 A | | 1/1996 | Erickson |
| 5,998,816 A | | 12/1999 | Nakaki et al. |

FOREIGN PATENT DOCUMENTS

| DE | 196 03 829 A1 | 8/1997 |
| EP | 0 763 881 A2 | 9/1996 |

* cited by examiner

*Primary Examiner*—Helen Kwok
(74) *Attorney, Agent, or Firm*—Birch, Stewart, Kolasch & Birch, LLP (57) ABSTRACT

The invention relates to a method for manufacturing a silicon sensor structure and a silicon sensor. According to the method, into a single-crystal silicon wafer (10) is formed by etched opening at least one spring element configuration (7) and at least one seismic mass (8) connected to said spring element configuration (7). According to the invention, the openings and trenches (8) extending through the depth of the silicon wafer are fabricated by dry etch methods, and the etch process used for controlling the spring constant of the spring element configuration (7) is based on wet etch methods.

15 Claims, 7 Drawing Sheets

METHOD FOR MANUFACTURING A SILICON SENSOR AND A SILICON SENSOR

This application is the national phase under 35 U.S.C. § 371 of PCT International Application No. PCT/FI02/00241 which has an International filing date of Mar. 21, 2001, which designated the United States of America.

The invention is particularly intended for use in the manufacture of silicon-based acceleration and angular velocity sensors.

As to its basic principles, silicon micromechanics utilizes so-called planar technology, that is, a kind of thin-film technique and the manufacturing methods developed thereon. Micromechanical fabrication techniques are tailored by combining basic processes in different fashions, adjusting their parameters to suite the intended application and designing desired structures that are implemented by transferring the layout patterns onto substrates, generally in a plurality of manufacturing steps. Among others, the basic processes include the deposition of different kinds of thin films, etching the same and modifying their properties by way of, e.g., controlled heat-treatments.

The basic processes of thin-film technology include patterning of thin films and, more generally, transfer of patterns into structures using techniques in which patterning and etch processes are integrated with each other. The most commonly employed patterning technique is based on the use of a photosensitive resist applied on the surface of a wafer or other substrate by spraying on or rotation (spinning) of the wafer. After the steps of baking the resist, exposing the patterns by means of ultraviolet light from a mask onto the substrate and, in the case of a positive resist, removal of the exposed areas of the resist by rinsing with a developer, the patterns thus formed on the deposited mask layer can be further transferred into the underlying layers of the wafer. The latter operation is performed using a sacrificial process known in the art as etching that, according to the nature of its working mechanism, is called either a wet etch process or a dry etch process.

Wet etch takes place in an etch solution, whereby the sacrificial material dissolves into the liquid etch solution, typically forming a plurality of different intermediate compositions. Most ones of the etch processes are isotropic, which means that their etch rate is the same in different orientations. However, monocrystalline silicon may also be etched using an anisotropic etch solution, whereby the etch rates in the different crystal orientation of the substrate material can be widely different from each other. This feature is utilized in conventional silicon micromechanics for forming precision structures aligned according to the crystal orientations. Anisotropic etching of silicon is also characterized by a very uniform depth of the etched volume and a smooth surface structure of the etched surface. Typically, the surface roughness of the etched volume is in the order of a tenth of one percent.

In a dry etch process, the reactive components of the gas-phase atmosphere react on the wafer surface so as to form volatile compounds, whereby the solid material is converted into a gaseous form. Typically, the reactor chamber is operated under a partial vacuum, whereby the gaseous reaction products are removed by pumping therefrom.

In wet etch techniques, pattern transfer is implemented using inorganic thin-film hard masks in addition to conventional resist masks. This procedure is typical of, e.g., anisotropic etching of silicon that is carried out in a concentrated alkaline solution. Since a photoresist cannot stay intact in such circumstances, conventionally oxide or nitride hard masks are used as the actual etch masks. Hereby, these masks of an inorganic material are first patterned using a photoresist in combination with dry or wet etch processes.

Three-dimensional micromechanical structures can be fabricated either by utilizing the entire thickness of the substrate, whereby the technique is known as bulk micromechanics, or, alternatively, by forming the structures to be released by etching so that they are located substantially in the surface layers of the substrate or a thin-film layer deposited onto the surface of the substrate. The latter technique is called surface micromechanics. Bulk micromechanical structures are fabricated by using a thin-film patterning process to fabricate the etching masks onto the wafer surfaces and then transferring the patterns by means of different etch processes into the substrate itself.

Dry etching is a term commonly used in conjunction with gas-phase etch processes in order to make a distinction from wet etch processes carried out in a liquid environment. The normal dry etch method is to use a plasma discharge, typically a corona discharge in a gas atmosphere under a partial vacuum, whereby the discharge is excited by an electric AC field or, less frequently, a DC field. The basic techniques of controlling an etch process are to adjust the composition of the gas atmosphere, its pressure, the excitation power of the plasma discharge and the geometry of the plasma etch chamber. Etching is terminated either at the lapse of a predetermined is, etch time, by measuring the impedance of the plasma discharge or using an optical etch end point system based on monitoring the emission of the plasma discharge. Also the optical detection of structures becoming visible from the monitored specimen can be used for determining the end point of sufficient etching.

As process gases are used such that can react with the material to be etched so as to form gaseous reaction products. These include, e.g., sulfur hexafluoride ($SF_6$), tetrafluoromethane ($CF_4$) and chlorine ($Cl_2$). In the plasma, the gas dissociates partially, whereby the reactive fluorine, chlorine or other radicals can react with the substrate being etched. The plasma process may be modified by introducing into the reaction chamber along with the reactive gas some inert gas or gases such as argon (Ar) or helium (He). These gases serve to stabilize the etch reaction or improve the thermal conductivity of the process atmosphere. The properties of the plasma discharge may further be controlled by adding certain gases such as oxygen ($O_2$) that are capable of altering the reaction equilibrium. Thereby it is possible for instance to elevate the level of free fluorine in certain reactions thus increasing the etching rate of the material being removed or, alternatively, to control the sidewall contour in the layer being etched when a photoresist mask is used. A third group of agents affecting the plasma process are passivating or polymerizing gases such as formaldehyde ($CHF_3$) or octafluorocyclobutane ($C_4F_8$).

To etch deep trenches in silicon, a particular dry-etch method is used based on pulsed or alternating etch cycles. Herein, an almost isotropic etch is applied in alternating step for rapidly machining into silicon patterns as deep as 1 $\mu$m. Subsequently, the substrate is subjected to a passivation step, whereby all the surfaces of the substrate including those just etched are covered by a polymer layer deposited from plasma gas. The next step of a rapid isotropic etch phase punches the polymer layer at the bottom of the pattern trenches thus deepening the patterns by one increment. Simultaneously, the polymer layer deposited on the sidewalls of the pattern protect them from further etching. The etch gas is typically sulfur hexafluoride, while the passivating gas is octafluorocyclobutane. This succession of alternating etch/passivation steps is continued until the desired depth of etched pattern is attained. By means of this technique it is possible to etch narrow slots through the entire thickness of a silicon wafer so that the aspect ratio, that is, the depth-to-width ratio of the etched trench can attain values from 10 to 40. Such a dry etch process is very anisotropic particularly in regard to the surface being etched. As to the behavior of etch masks, the method gives in a routine fashion excellent selectivity defined as the ratio of the etch rate of the substrate to the etch rate of the mask material. Using an oxide mask, etch selectivity ratios as high as 200 to 300 can be attained, while even a resist mask may reach etch selectivity ratios in the range of 50–100. Typically, a conventional unpulsed plasma etch process can provide an etch selectivity ratio which is only one-tenth of these values. The etch surface roughness values herein are generally in the order of a few percent.

Etch processes that are anisotropic in regard to the surface orientation of the substrate being etched, including such processes as anisotropic dry etch processes (wherein the etch rate in an orientation perpendicular to the substrate surface is much faster than in the an orientation parallel to the substrate surface), facilitate the fabrication of openings extending in almost undefined shapes as deep as even through the entire silicon wafer with sidewalls that are substantially vertical. However, the instantaneous etch rate due to the inherent nature (ARDE, Aspect Ratio Dependent Etching) of the method is dependent on the geometry of the opening being made. Resultingly, it becomes imprecise or even impossible to fabricate narrow-aspect slots of a desired depth or, e.g., thin spring elements in the central plane of a wafer.

Spring elements located in the central plane of a wafer can be fabricated by using anisotropic etch processes in combination with isotropic etch processes (the latter having equal etch rate in all orientations). However, a good isotropic etch process has not yet been disclosed for silicon. Only the use of $XeF_2$ as isotropic etch gas has been reported in the art [Esashi et al.]

Single-crystal silicon wafers having their surfaces substantially aligned parallel to the {100} planes of the crystal structure can be used for fabricating spring elements located in the central plane of the wafer by using a wet etch process (typically based on a potassium hydroxide solution) that etches anisotropically along the different crystal orientations of silicon. This method gives a good surface quality of the spring element and a uniform etch rate.

One of the shortcomings of the prior art has been that dry etching as a single process has not been suitable for fabricating spring elements of high dimensional precision in the central plane of a silicon wafer. On the other hand, wet etching requires a large wafer area in the fabrication of deep structures by etching. The use of conventional wet etching techniques in the manufacture of elongated spring elements in particular makes the spring elements to be surrounded by large-area holes in which the etched surfaces are formed by {111} crystal planes. By the same token, it is extremely difficult to control the dimensional precision of the spring elements particularly as to their width that in conventional manufacturing decreases at a rapid rate when the end value of the spring element thickness is approached during the etch process. Even the smallest variations in the manufacturing process or in the initial thickness of the wafer can cause a large deviation in the end width of the spring element. Hence, it may become impossible to attain desired spring element qualities using this kind of geometry in the cross section of the spring element.

Acceleration sensors may also be manufactured based on multilayer structures of the SOI type comprising a set of superposed layers: thick silicon substrate-dielectric layer-thin silicon layer-dielectric layer-thick silicon layer. A drawback of this technique is that it involves a complicated and expensive manufacturing process.

It is an object of the present invention to overcome the problems of prior-art techniques and to provide an entirely novel manufacturing method and a silicon sensor based thereon.

The goal of the invention is achieved by way of using a dry etch process for making the through-the-wafer etchings and then finalizing the high-precision structures located in the central plane of the wafer by means of a wet etch process. Advantageously, the straight sidewalls of spring elements in a sensor structure, as well as the straight portions of angled spring legs or tangents of the curved portions thereof are askew away from the <110> orientation of the silicon substrate, advantageously by at least 15°, preferably by 45° which is equivalent to the <100> orientation, or, if the shape of the spring element is different from that of a rectangular parallelepiped, having the sidewalls or tangential planes of the spring elements askew approximately by 45° from the <110> orientation. In the case silicon wafers are used having a differently cut orientation, the general idea is to minimize the areas of inclined surfaces oriented in the {111} crystal planes within the volume occupied by the spring elements.

It is a feature of the invention to combine the advantages of two different kinds of etch processes.

As known, anisotropic wet etching in alkaline etch solutions works differently in the different crystal orientations thus giving an extremely uniform etch rate over the entire silicon surface, as well as a very smooth and flawless quality of the etched surface. Conventionally, the greatest shortcoming of this etch method has been related to its restrictions in the design of the spring element geometry. For instance the location of rectangularly shaped spring elements cannot be chosen freely, because the area required about these elements is manifold in regard to their own footprint.

Anisotropic dry etch processes currently used for silicon permit free design and location of spring elements. However, these etch methods give a surface roughness and quality which is orders of magnitude inferior as compared to the outcome of an anisotropic wet etch.

The present invention makes it possible to combine in an unprecedented fashion the unrestricted location and shaping of spring elements fabricated by anisotropic dry etch processes with the surface smoothness and quality offered by alkaline etch processes.

In addition to fabrication of spring elements in the central plane of a wafer, the method outlined above may also be used for fabrication of spring elements on the other side of the wafer. Herein, the anisotropic wet etching is carried out from one side of the wafer to a depth extending almost through the entire thickness of the wafer.

Besides being suited for making spring elements that are located substantially in the central plane of the wafer and are deflectable outward from the plane of the wafer, the method is suited for the fabrication of spring elements which are deflectable in the plane of the wafer and have their thickness controlled by the anisotropic etch process, whereby their bending stiffness is substantially determined by their width. The method is also suited for making torsion spring elements of high stiffness comprising a vertical and a horizontal portion or cantilever/torsion spring elements comprising only vertical portion free to move only in the plane of the silicon wafer. Furthermore, these elements can be combined with spring elements located in the central plane of the wafer.

In the following, the invention will be examined in greater detail with the help of exemplary embodiments illustrated in the appended drawings in which.

In the diagrams and the text below, the parenthesis notation is used to indicate the crystalline geometry of silicon is as follows:

< . . . > equivalent crystal orientation,
{ . . . } equivalent crystal plane,
[ . . . ] individual crystal orientation, and
( . . . ) individual crystal plane.

Accordingly, the invention typically relates to the manufacturing technology described below.

The sensor spring elements are fabricated from a silicon wafer by thinning the wafer from one or both sides by an etch process. The surfaces of the silicon wafer are essentially ideal {100} crystal planes. The spring elements are essentially located in the central plane of the silicon wafer. The thinning of the spring elements is performed using chemicals such as alkali hydroxides or organic bases that etch silicon anisotropically in regard to the crystal orientations thereof. The shape of the spring elements in the plane of the silicon wafer is controlled to certain dimensions by an etch process that attacks anisotropically perpendicular to a given plane of the wafer. The spring elements fabricated in the above-described fashion may further be connected to torsion spring elements comprising both a vertical and a horizontal portion, as well as to other deflection or torsion spring elements comprising only one narrow portion essentially having a height equal to the wafer thickness.

Novel features in the embodiment according to the invention are, among others, the following characterizing details. Firstly, the straight sidewalls of the spring elements, straight portions of angled spring legs or tangents of the curved portions thereof are askew by at least 15° from the <110> orientation of the silicon crystal structure, preferably by 45°, that is, in the <100> orientation, or, if the shape of the spring element is not rectangular, the sidewalls or tangents of the elements are on the average askew by 45° from the <110> orientation. Secondly, the ends of the spring elements are at least partially delineated by two intersecting {111} crystal planes.

An unexpected finding of the invention is that it has become a tradition in the art to aim at a maximum precision in the alignment of the straight sidewalls of patterns in the <110> orientations when etching is performed using alkali hydroxide or other anisotropic basic wet etch processes. Now, the present invention utilizes a novel concept according to which a relatively small deviation from the conventional alignment of pattern sidewalls can make an anisotropic etch to work so that the {111} crystal planes of silicon do not become exposed so as to retard etching. In the invention, the etching rate in critical orientations is controlled by means of vertical trenches which are made in the silicon substrate in orientations askew from the conventionally used <110> orientation, e.g., substantially in the <100> orientation, and are further protected at their sidewalls against etching.

Figures 1, 2:
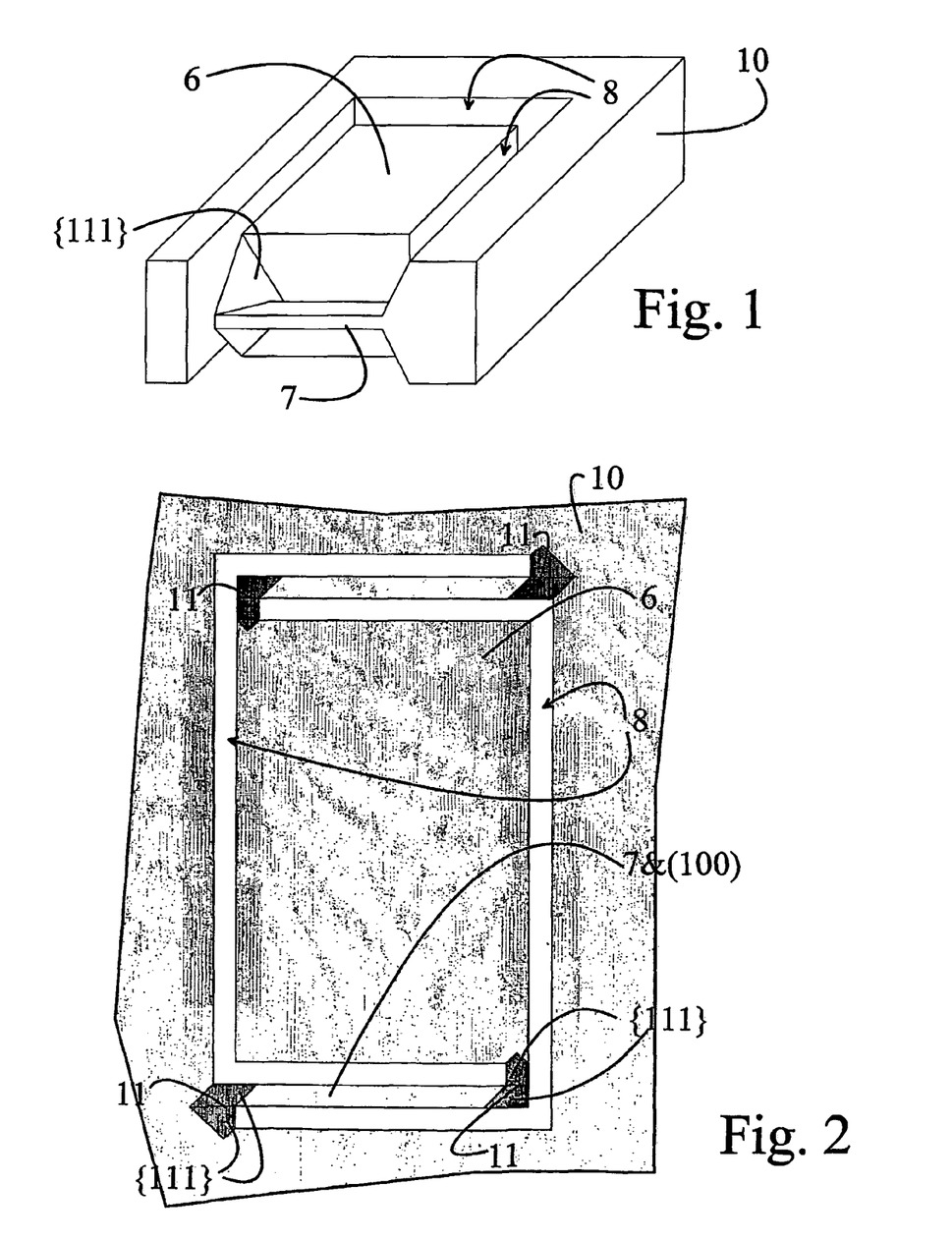
FIG. 1 is a perspective view of a silicon sensor according to the invention.
FIG. 2 is a top view of an essentially similar silicon sensor as that of FIG. 1.

As shown in FIG. 1, a typical acceleration sensor structure comprises a frame 10 whereto a seismic mass 6 is connected via a spring 7. The seismic mass 6 is micromachined from the substrate 10 with the help of dry etched trenches 8. The springs 7 are made by wet etching, whereby the spring element ends have become slanted in the {111} crystal planes.

The dry etching of trenches 8 is usually performed in a plasma-assisted process, whereby the reactive species of the gas phase react on the wafer surface so as to form volatile compounds. Resultingly, the solid substrate material to be removed from the trenches 8 is converted into gaseous form, whereby it can be pumped out from the reactor chamber operating at a partial vacuum. The reaction is maintained by continuous infeed of the reactive process gases, sustained vacuum pumping and a reaction chamber pressure control system connected thereto, as well as a plasma system excited by an RF field. The etch depth is typically controlled by adjusting the etch time or using an etch end point detector based on monitoring the optical emission of the plasma. In the dry etch process, the etch selectivity can be varied by a proper choice of the process parameters and the etch method used from an almost isotropic etch to a strongly anisotropic etch. In the context of the present method, the term anisotropic etch is used when reference is made to unequal etch rates in regard to an orientation perpendicular to the substrate surface and an orientation parallel to the substrate surface. Also the contour of an etched edge can be controlled by modifying the etch chemistry and the process parameters. In dry etching, however, the etch rate is generally fully independent from the crystal orientation.

In the exemplary embodiment illustrated in FIG. 2, the surface of the spring element 7 is almost over its entire area formed by the {100} crystal plane. The choice of etch orientations according to the invention causes that the {111} crystal planes are formed only at the ends of the spring element 7. An additional benefit of this condition in terms of sensor strength is that the {111} crystal planes thus create thicker portions on both supporting ends of the spring element 7, that is, both at the end connected to the seismic mass 6 and the end connected to the substrate 10. The {111} crystal planes intersect with each other along an intersection line 11 at the ends of the spring element 7 or in a close vicinity thereof.

Figure 3A:
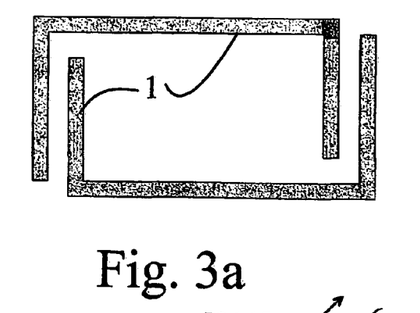
FIGS. 3a–3d illustrate the manufacturing steps of the sensor of FIG. 3.
Figure 3B:
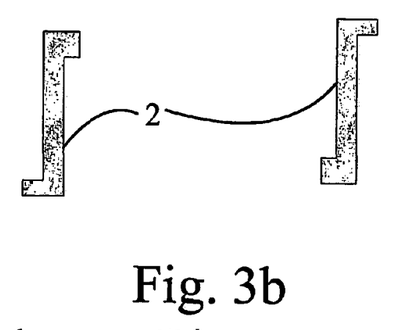
Figure 3C:
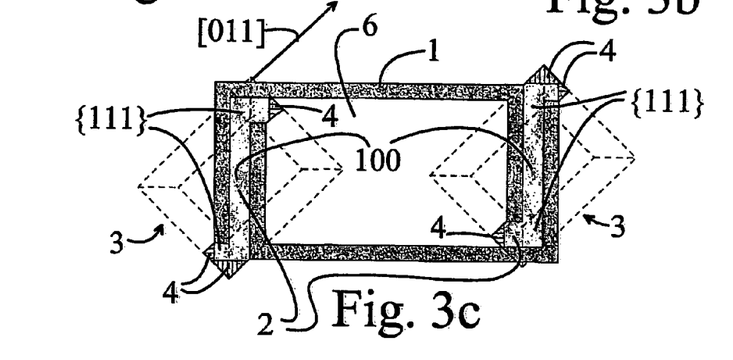

In FIG. 3a is visible an area 1 which defines a trench 8 extending through the entire thickness of the silicon wafer and also can be seen in process picture 5c to be described later. Respectively, FIG. 3b shows an area 2 which defines the portion to be formed into a spring element by means of wet etching. This area is also visible in process pictures 5a and 5e. FIG. 3c in turn shows an arbitrary area 3 to be processed by wet etching as to its orientation in regard to areas 1 and 2 as well as crystal orientation {110}. The sidewalls of the arbitrary area 3 to be wet etched will become aligned in the {110} crystal orientation in the fashion shown in the diagram. In a practicable process, the arbitrary area 3 will be etched only the portions defined in FIG. 2 plus small areas 4 that become undercut below the etch mask, however, only in a minor degree due to hindrance caused by the limited etch rate of the {111} crystal planes. The seismic mass 6 is formed in the center of the processed area, while the areas denoted by dashed line represent areas on which are formed both the ends of the springs terminated by the {111} planes and springs proper aligned in the (100) crystal plane of the wafer surface.

Figure 3D:
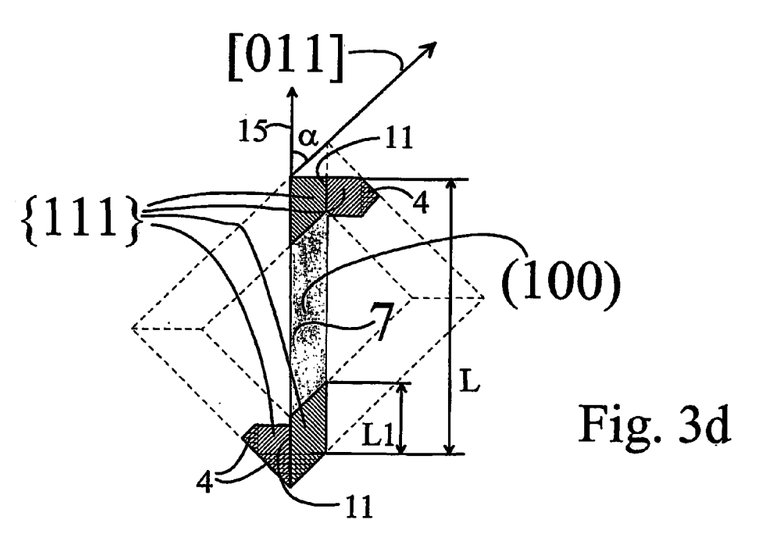

In FIG. 3d are shown at the ends of the fabricated spring element 7 the areas which are delineated by the {111} crystal planes so as to intersect along line 11. In the illustrated case, the angle α between the [011] crystal orientation drawn in the diagram so as to represent an equivalent <110> crystal orientation and the longitudinal axis 15 of the spring element is 45°, whereby also the surface projection of the intersection line 11 of {111} crystal planes is oriented parallel to the longitudinal axis of the spring element 7. Inasmuch as it is one object of the invention to maximize the flat portion of the spring element 7, that is, to obtain a maximally long area of the (100) crystal plane to remain free on the spring surface, the angle α is should be sufficiently close to 45° in order to attain this goal.

The process may also be examined by considering the length L of the spring element 7 in regard to the longitudinal dimension L1 of the spring element 7 in the direction of the {111} crystal plane. Obviously, the dimension of L1 is directly dependent on the etching depth and angle α. The design of the sensor can be made insensitive to production deviations if the ratio L1/L is small, e.g., less than 0.2. This assures that a relatively large portion of the substrate area reserved for the spring element forms the spring proper, whereby other dimensions of the spring element need not be minimized to the limits of production tolerances. If angle α is different from 45°, the ratio L1/L increases. In accordance with the invention, a proper value for the ratio L1/L is smaller than 0.45, whereby a reasonable large area of the spring element 7 can be made planar. In accordance with the invention, the angle α between the longitudinal axis of the spring element 7 and the equivalent <110> crystal orientation in the plane of the silicon wafer is typically 25° to 65°, advantageously about 45°.

Figure 4:
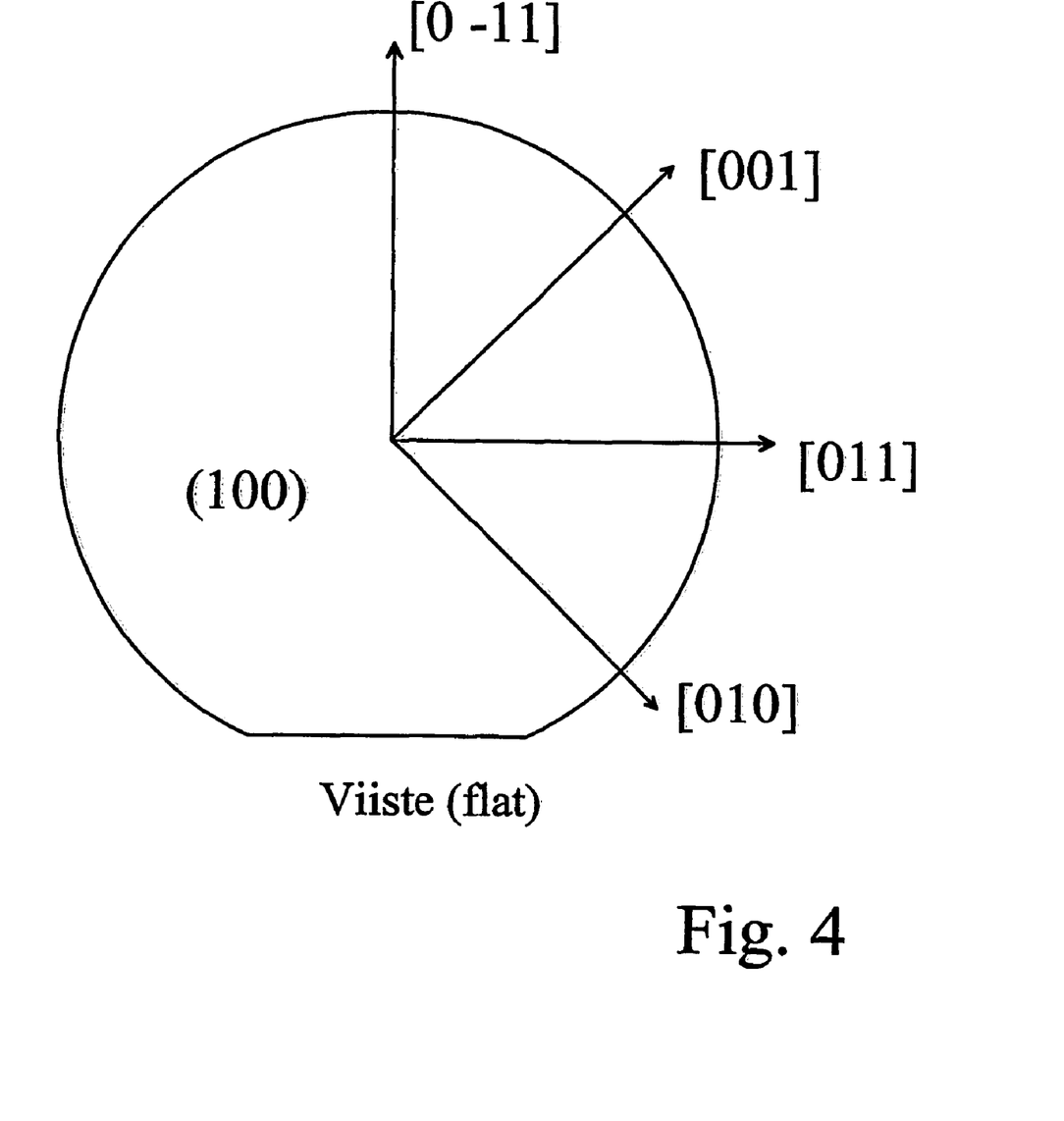
FIG. 4 illustrates the crystal orientations of a silicon wafer.

In FIG. 4 are illustrated the crystal orientations of a typical single-crystal silicon wafer made in the (100) orientation. Herein, the <100> orientation denotes all the crystal orientations, the total number thereof being 6, which are equivalent to the [100] crystal orientation. Respectively, the {100} plane denotes all the crystal planes that are equivalent to the (100) plane. Normals to the {100} planes are denoted as <100> orientations. When the wafer is examined as in the diagram from a direction perpendicular to the wafer plane, the wafer surface is the (100) plane meaning that the wafer surface normal is in the [100] orientation. Further, the flat of the wafer is parallel to the [011] crystal orientation which is equivalent to the <110> orientation. In a 45° angle thereto and in the plane of the wafer are two crystal orientations equivalent to the <100> orientation, namely the [010] and [001] orientations that are drawn in FIG. 4. Still further in the wafer plane is another orientation equivalent to the <110> orientation, namely the [0-11] orientation which is normal to the flat. In the plane of the wafer, the [011] and [0-11] crystal orientations, which are equivalent to the <110> orientation, form a 45° angle with the two other wafer-plane orientations, namely [010] and [001], which are equivalent to the <100> orientation, but simultaneous these latter two also form a 90° angle with the [100] orientation which is equivalent to the <100> orientation that is the direction of a normal to the plane of the wafer. Hence, the overall number of orientations equivalent to <110> is 12 of which four are located in the plane of the (100) wafer. Two of these orientations are drawn in FIG. 4, namely the individual crystal orientations of [011] and [0-11].

Figure 5A:
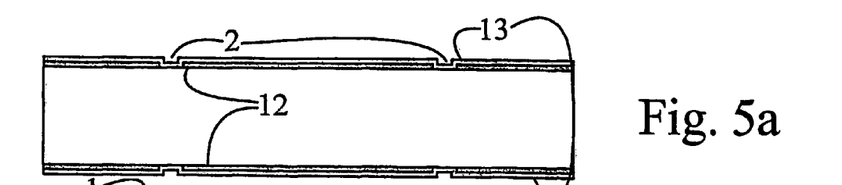
FIGS. 5a–5g illustrate in cross-sectional views taken at the sensor inertial mass element the manufacturing steps of a sensor according to the invention.

As illustrated in FIGS. 5a–5g, a typical sensor manufacturing process comprises the following sequence of steps:

FIG. 5a:
20. Depositing oxide layer 12.
21. Defining spring element openings 2.
22. Depositing nitride layer 13.

Figures 5B, 5C:
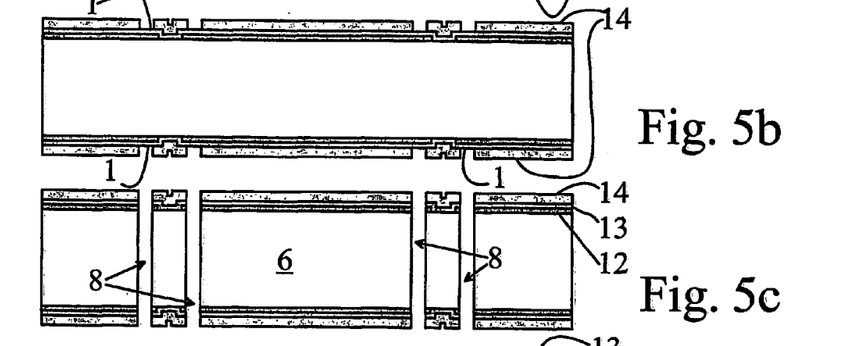

FIG. 5b:
23. Defining areas 1 for through-etching by means of photoresist 14.

FIG. 5c:
24. Etching-away nitride layer 13 (and oxide layer 12) on area 1.
25. Dry etching through wafer on one or both sides at area 1.

Figure 5D:
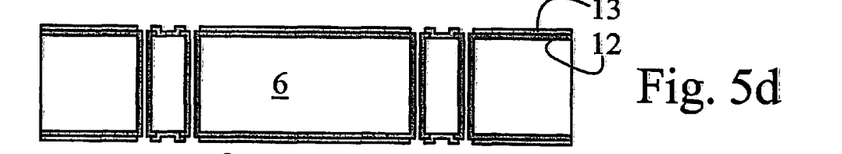

FIG. 5d:
26. Stripping away photoresist 14.
27. Oxidizing sidewalls of trenches 8.

Figure 5E:
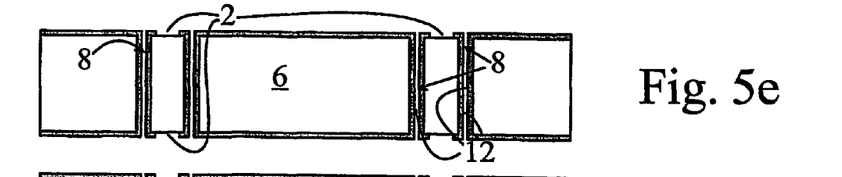

FIG. 5e:
28. Removing nitride layer 13 and exposing spring element openings 2.

Figure 5F:
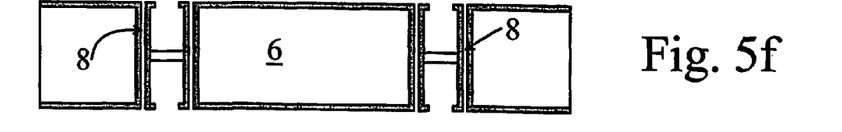

FIG. 5f:
29. Forming spring elements 7 by wet etching.

Figure 5G:
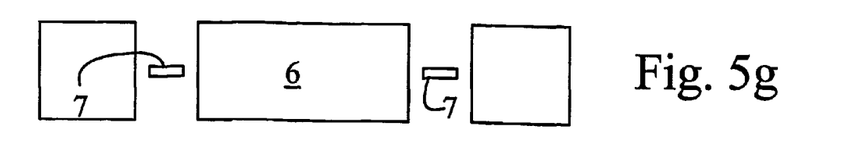

FIG. 5g:
30. Removing masks.

Figure 6:
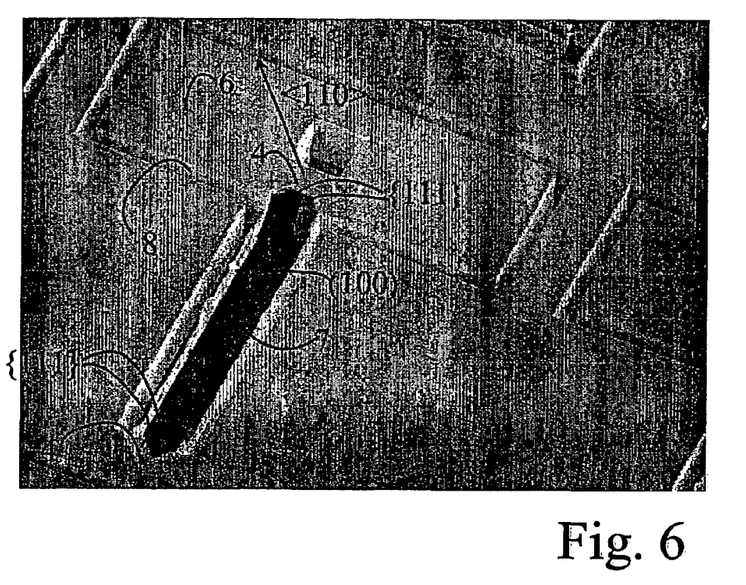
FIG. 6 is a photograph taken from a first embodiment of a sensor structure according to the invention during its manufacture.

In FIG. 6 is shown in more detail the structure of the acceleration sensor spring 7. The diagram elucidates the angle of about 45° between the spring element 7 and the equivalent <110> crystal orientation.

Figure 7:
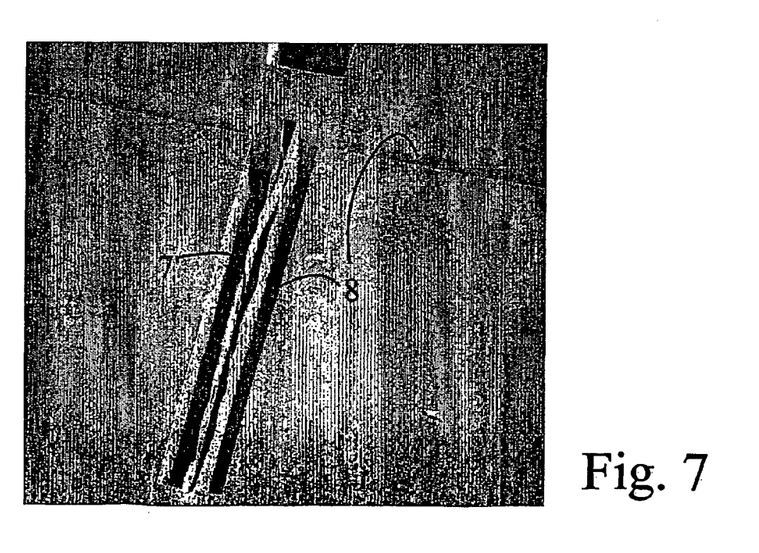
FIG. 7 is a photograph taken on the dry-etching and the narrow spring element of the sensor prior to the removal of the sidewall masks.

In FIG. 7 is illustrated the capability of dry etching to accomplish precision through-etchings not affected by crystal orientations and to make very narrow spring elements.

Figure 8:
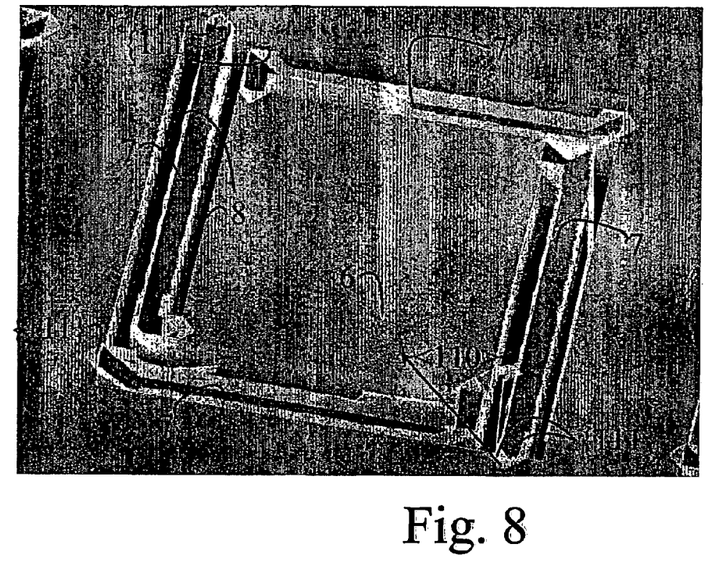
FIG. 8 is a photograph of a second embodiment of an acceleration sensor according to the invention.

In FIG. 8 is illustrated a more complicated sensor structure having all four sensor elements 7 fabricated at a 45° angle in regard to the equivalent <110> crystal orientation.

Figure 9:
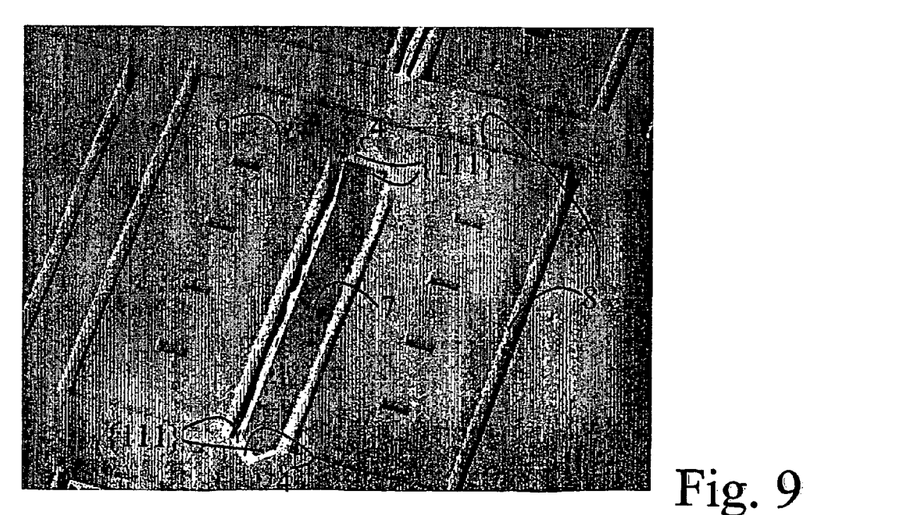
FIG. 9 is a photograph of a third embodiment of an acceleration sensor according to the invention.

In FIG. 9 is further illustrated a sensor structure having the spring element 7 extending into the seismic mass 6. At the ends of the spring element 7 are visible the {111} crystal planes whereby the projection of their intersection line on the wafer surface is substantially parallel to the longitudinal axis of the spring element 7.

Figure 10:
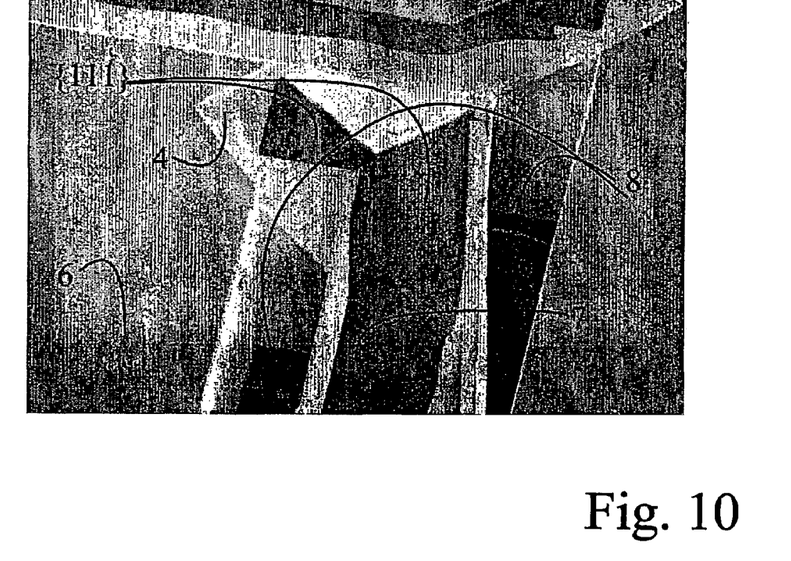
FIG. 10 is a photograph taken from a detail of the sensor of FIG. 8.

In FIG. 10 is shown a detail of the end of the spring element of FIG. 8.

Figure 11:
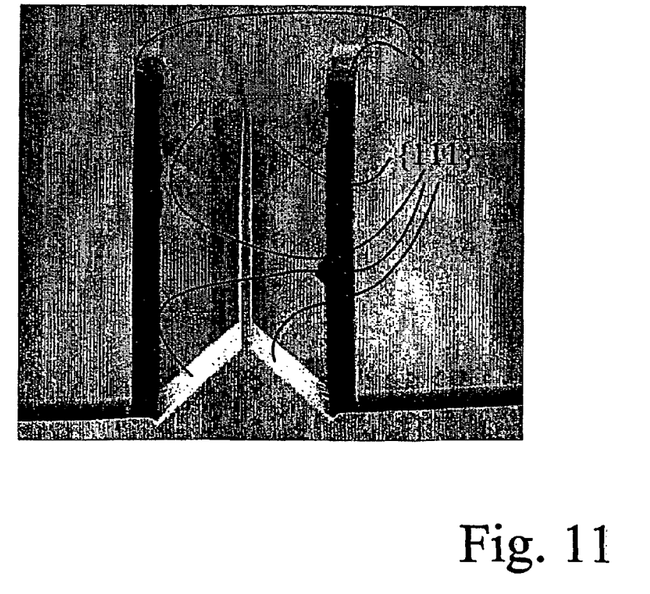
FIG. 11 is a photograph of a torsion spring element according to the invention.

In FIG. 11 is further shown a torsion spring element fabricated according to the invention. The {111} crystal planes are herein easily visible.

The invention may be applied to acceleration sensors and oscillating angular velocity sensors, for instance.

Without departing from the scope and spirit of the invention, it may also be applied to the processing of wafers different from monocrystalline (single crystal) (100) silicon wafers.

What is claimed is:
1. A method for manufacturing a silicon sensor structure, the method comprising the steps of:

forming by etched openings into a single crystal silicon wafer at least one spring element configuration and at least one seismic mass (8) connected to said spring element configuration, fabricating openings and trenches extending through a depth an entire thickness of the silicon wafer by dry etch methods, and basing an etch process used for controlling the spring constant of the spring element configuration on anisotropic wet etch methods after said fabricating step.

2. The method of claim 1, wherein an angle α between a longitudinal axis of the spring element configuration and an equivalent crystal orientation in the plane of the silicon wafer selected to be greater than 15°.

3. The method of claim 1, wherein a ratio L1/L between a length L of the spring element configuration to a longitudinal dimension L1 thereof in the direction of the crystal plane is selected to be smaller than 0.45.

4. The method of claim 1, wherein the wet etch method is carried out using alkaline etch processes that are anisotropic in regard to different crystal orientations.

5. The method of claim 1, wherein the etching of structures in orientations other than those perpendicular to a wafer plane is limited by making into the wafer such vertical trenches that are aligned substantially in different orientations than the orientation of the silicon wafer and are protected at sidewalls of the trenches against etch attack.

6. The method of claim 3, wherein both the dry etch method and the wet etch method are anisotropic.

7. The method of claim 2, wherein a ratio L1/L between a length L of the spring element configuration to a longitudinal dimension L1 thereof in the direction of the crystal plane is selected to be smaller than 0.45.

8. The method of claim 2, wherein the wet etch method is carried out using alkaline etch processes that are anisotropic in regard to different crystal orientations.

9. The method of claim 3, wherein the wet etch method is carried out using alkaline etch processes that are anisotropic in regard to different crystal orientations.

10. The method of claim 2, wherein the etching of structures in orientations other than those perpendicular to a wafer plane is limited by making into the wafer such vertical trenches that are aligned substantially in different orientations than the orientation of the silicon wafer and are protected at sidewalls of the trenches against etch attack.

11. The method of claim 3, wherein the etching of structures in orientations other than those perpendicular to a wafer plane is limited by making into the wafer such vertical trenches that are aligned substantially in different orientations than the orientation of the silicon wafer and are protected at sidewalls of the trenches against etch attack.

12. The method of claim 4, wherein the etching of structures in orientations other than those perpendicular to a wafer plane is limited by making into the wafer such vertical trenches that are aligned substantially in different orientations than the orientation of the silicon wafer and are protected at sidewalls of the trenches against etch attack.

13. The method of claim 2, wherein the equivalent crystal orientation is selected to be between 25° and 65°.

14. The method of claim 13, wherein the equivalent crystal orientation is about 45°.

15. The method of claim 1, wherein said dry etch method includes no etch stop.

* * * * *